(12) United States Patent
Chang et al.

(10) Patent No.: US 7,719,625 B2
(45) Date of Patent: May 18, 2010

(54) ACTIVE DEVICE ARRAY SUBSTRATE, LIQUID CRYSTAL DISPLAY PANEL, ELECTRO-OPTICAL DEVICE, METHOD FOR FABRICATING THE SAME, AND METHODS FOR DRIVING THE SAME

(75) Inventors: Lee-Hsun Chang, Hsinchu (TW); Yu-Wen Lin, Hsinchu (TW); Chih-Yu Peng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 162 days.

(21) Appl. No.: 12/170,445

(22) Filed: Jul. 10, 2008

(65) Prior Publication Data

US 2009/0268118 A1   Oct. 29, 2009

(30) Foreign Application Priority Data

Apr. 23, 2008   (TW) ............................... 97114888 A

(51) Int. Cl.
*G02F 1/136* (2006.01)
(52) U.S. Cl. .......................................... 349/43; 349/42
(58) Field of Classification Search ........................ None
See application file for complete search history.

(56) References Cited

U.S. PATENT DOCUMENTS 6,392,620 B1    5/2002    Mizutani et al.
2009/0096950 A1*  4/2009    Kim et al. ..................... 349/43

FOREIGN PATENT DOCUMENTS

TW    I251693    3/2006
TW    I277934    4/2007

* cited by examiner

*Primary Examiner*—Sung H Pak
(74) *Attorney, Agent, or Firm*—Jianq Chyun IP Office

(57) ABSTRACT

An active device array substrate is provided. The active device array substrate includes a plurality of pixel units. Each of the pixel units includes a first active device, a first scan line, a second active device, a second scan line, a data line, a common line, and a pixel electrode. The first scan line is electrically connected to a first gate of the first active device. The second scan line is electrically connected to a second gate of the second active device. The data line is electrically connected to a first source of the first active device. The common line is electrically connected to a second source of the second active device. The pixel electrode is electrically connected to a first drain of the first active device and a second drain of the second active device.

17 Claims, 7 Drawing Sheets

ACTIVE DEVICE ARRAY SUBSTRATE, LIQUID CRYSTAL DISPLAY PANEL, ELECTRO-OPTICAL DEVICE, METHOD FOR FABRICATING THE SAME, AND METHODS FOR DRIVING THE SAME

CROSS-REFERENCE TO RELATED APPLICATION

This application claims the priority benefit of Taiwan application serial no. 97114888, filed Apr. 23, 2008. The entirety of the above-mentioned patent application is hereby incorporated by reference herein and made a part of this specification.

BACKGROUND OF THE INVENTION

1. Field of the Invention

The present invention generally relates to a liquid crystal display (LCD) panel and a method for driving the same, and more particularly, to an active device array substrate and a method for fabricating the same.

2. Description of Related Art

As the display technology being progressively developed, human's daily life becomes more convenient assisted by displays. Lightness and thinness are features desired for the displays, and correspondingly flat panel displays (FPD) have gradually become the mainstream of the display market. There are many kinds of FPDs provided in the market, among which liquid crystal displays (LCD) are more favorite to the consumers because of the advantageous features such as more efficient space utilization, lower power consumption, non-radiance, and low electromagnetic interference (EMI).

Conventionally, in typical hold type LCD displays, the pixel unit is designed to hold to display an image data until a next image data is input in pixel unit. However, when such a hold type LCD display is used in displaying dynamic images, a problem of image blur may occur. Addressing to this problem, many solutions have been proposed. One of the solutions is called "black insertion".

The black insertion technologies can be divided into data black insertion technology and dynamic backlight (DBL) technology. The DBL technology utilizes a backlight module in the LCD display to achieve the black insertion. As such, the DBL technology increases the manufacturing cost of the backlight module, and unfortunately shortens the lifetime of the backlight module. The data black insertion (DBL) technology can be achieved by alternately providing an image data frame and a black image frame. However, the pixels in the LCD panel require sufficient time for charging, which cannot traded off for inserting the black frame. In other words, inserting the black frame disadvantageously decreases the time for charging the pixels. Further, the data black insertion technology requires source drivers for transmitting image data of the black frame to the LCD panel via data lines, and therefore the data black insertion technology unfortunately complicates the fabrication and the design of the source drivers.

SUMMARY OF THE INVENTION

Accordingly, the present invention is directed to an active device array substrate, wherein each pixel unit of the active device array substrate includes two active devices which are adapted to transmit an image data and execute black insertion, respectively.

The present invention is further directed to a LCD panel having the foregoing active device array substrate.

The present invention is further directed to a method for driving the foregoing LCD panel.

The present invention is further directed to a method for fabricating the foregoing active device array substrate.

The present invention is further directed to an electro-optical device including the foregoing LCD panel.

The present invention is further directed to a method for driving the electro-optical device.

The present invention is further directed to a method for fabricating the foregoing electro-optical device.

The present invention provides an active device array substrate including a substrate and a plurality of pixel units. The pixel units are disposed on the substrate. Each of the pixel units includes a first active device, a first scan line, a second active device, a second scan line, a data line, a common line, and a pixel electrode. The first active device, the first scan line, the second active device, the second scan line, the data line, the common line, and the pixel electrode are disposed on the substrate. The first active device includes a first gate, a first source, and a first drain. The first scan line is electrically connected to the first gate of the first active device. The second active device includes a second gate, a second source, and a second drain. The second scan line is electrically connected to the second gate of the second active device. The data line is electrically connected to the first source of the first active device. The common line is electrically connected to the second source of the second active device. The pixel electrode is electrically connected to the first drain of the first active device and the second drain of the second active device. When the first active device is turned on, the data line and the pixel electrode are electrically connected to each other by the first active device. When the second active device is turned on, the common line and the pixel electrode are electrically connected to each other by the second active device.

The present invention further provides an LCD panel. The LCD panel includes an active device array substrate, an opposite substrate, and a liquid crystal layer disposed between the active device array substrate and the opposite substrate. The active device array substrate includes a substrate, and a plurality of pixel units disposed on the substrate. Each of the pixel units includes a first active device, a first scan line, a second active device, a second scan line, a data line, a common line, and a pixel electrode. The opposite substrate includes a common electrode. The common line is electrically connected to a first common voltage Vcom1, and the common electrode is electrically connected to a second common voltage Vcom2, in which |Vcom1−Vcom2| is substantially greater than a voltage difference corresponding to a grey level L0, such as lowest grey level.

The present invention further provides a method for driving the foregoing LCD panel. The method includes: turning on the first active devices controlled by the first scan lines in sequence, and recording image data into the pixel units via the data lines; turning on the second active devices controlled by the second scan lines in sequence, so that a voltage of the pixel electrode of each pixel unit is the first common voltage Vcom1. The first active device and the second active device of a same pixel unit are turned on at different times.

The present invention further provides a method for fabricating an active device array substrate. The method includes: forming a first patterned conductive layer on a substrate, the first patterned conductive layer including a plurality of first scan lines, a plurality of second scan lines, and a plurality of common lines; then, forming a gate insulating layer on the substrate and covering the first patterning conductive layer;

then forming a plurality of first channel layers over the first scan lines on the gate insulating layer and a plurality of second channel layers over the second scan lines on the gate insulating layer; then, forming a second patterned conductive layer on the gate insulating layer, the second patterned conductive layer including a plurality of first drains, a plurality of second drains, a plurality of data lines, a plurality of first sources electrically connected with the data lines, and a plurality of second sources electrically connected with the common lines. The first sources and the first drains cover a part of the region of the first channel layers. The second sources and the second drains cover a part of region of the second channel layers. The method further includes: forming a passivation layer on the gate insulating layer and covering the second patterned conductive layer; and forming a plurality of pixel electrodes on the passivation layer, the pixel electrodes being electrically connected with the first drains and the second drains.

In the foregoing active device array substrate, and the foregoing LCD panel, the writing of the image data and the black insertion are executed by different active devices. As such, the images displayed on the LCD panel can be greatly improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
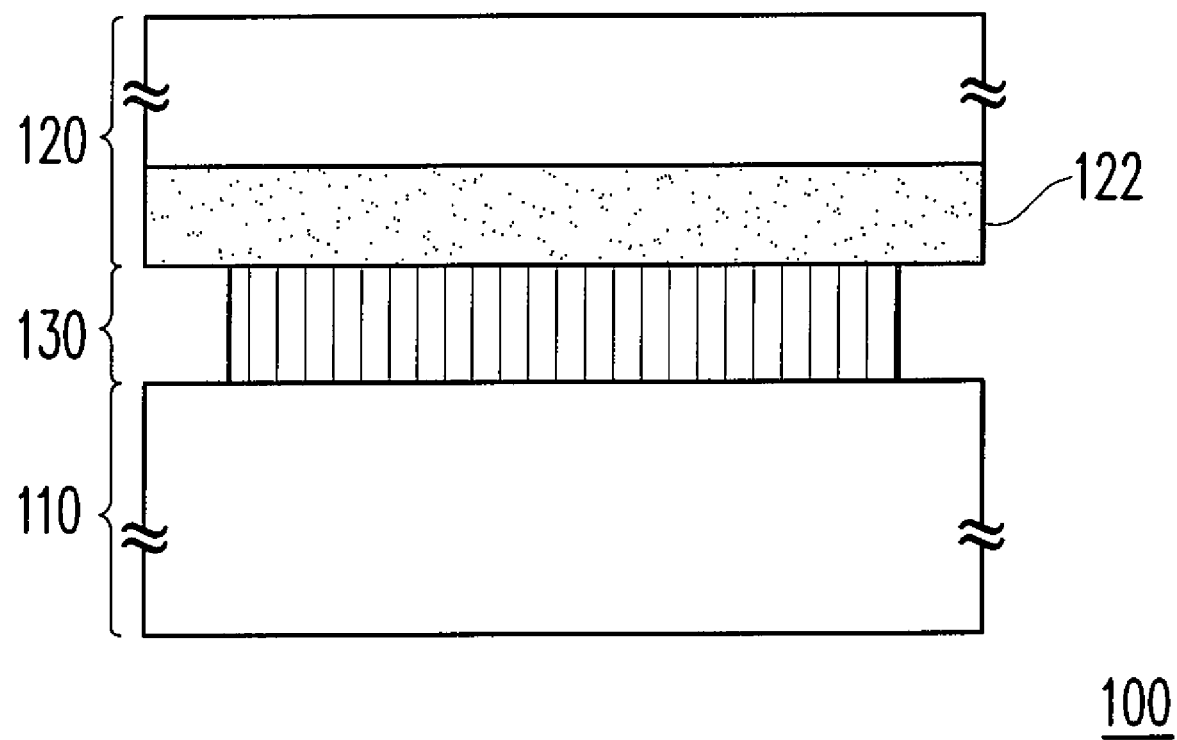
FIG. 1A is a cross-sectional view of an LCD panel according to an embodiment of the present invention.

Reference will now be made in detail to the present preferred embodiments of the invention, examples of which are illustrated in the accompanying drawings. Wherever possible, the same reference counting numbers are used in the drawings and the description to refer to the same or like parts.

Figure 1B:
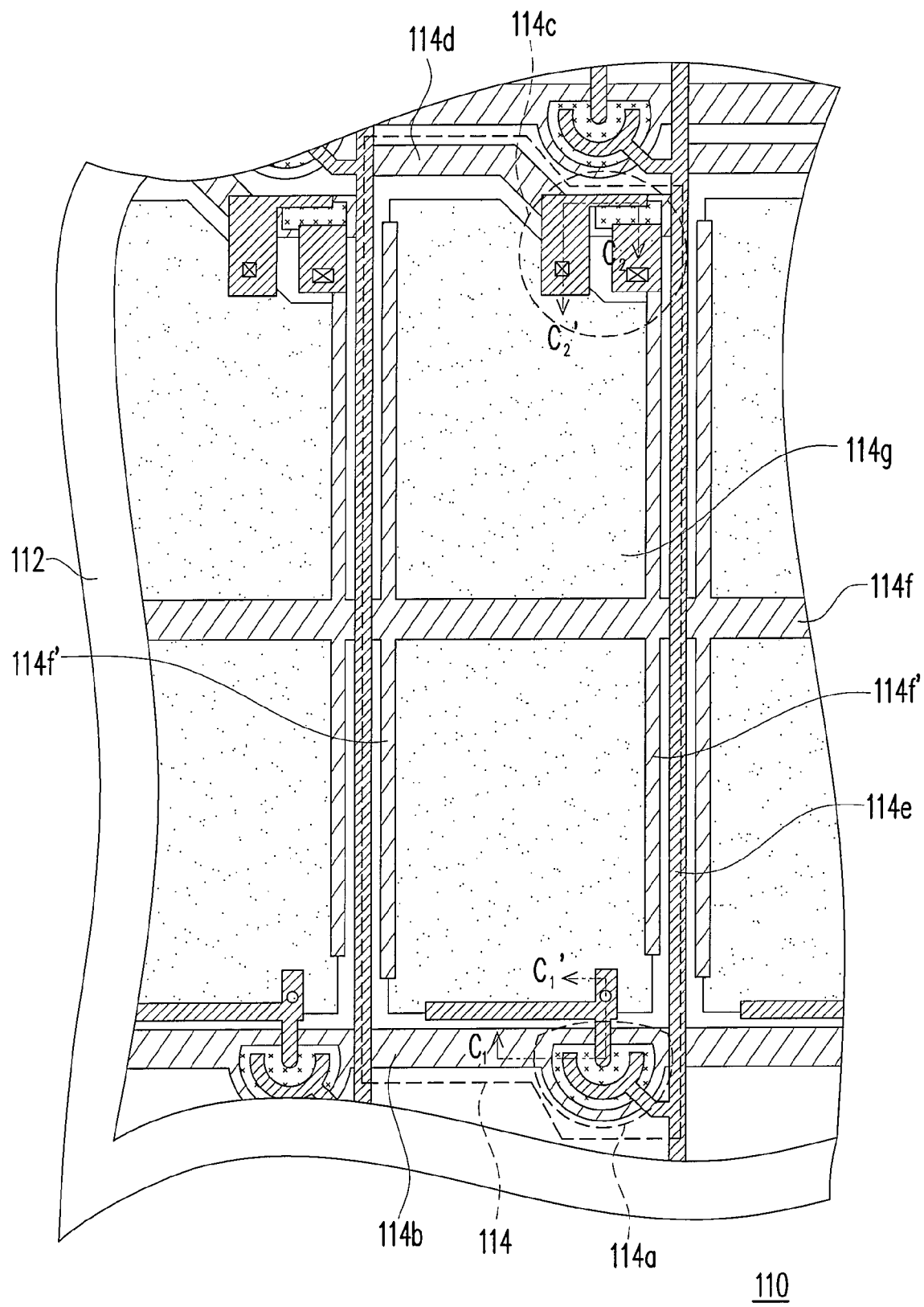
FIG. 1B is a partial view of an active device array substrate according to an embodiment of the present invention.

FIG. 1A is a cross-sectional view of a liquid crystal display (LCD) panel 100 according to an embodiment of the present invention. Referring to FIG. 1A, the LCD panel 100 includes an active device array substrate 110, an opposite substrate 120, and a liquid crystal layer 130. The active device array substrate 110 includes a substrate 112 (as shown in FIG. 1B) and a plurality of pixel units (not shown in FIG. 1A). The opposite substrate 120 includes a common electrode 122. The liquid crystal layer 130 is disposed between the active device array substrate 110 and the opposite substrate 120.

FIG. 1B is a partial view of the active device array substrate 110 according to an embodiment of the present invention. Referring to FIG. 1B, the active device array substrate 110 includes the substrate 112 and a plurality of pixel units 114 (only one shown for illustration). The pixel units 114 are disposed on the substrate 112. Each of the pixel units 114 includes a first active device 114a, a first scan line 114b, a second active device 114c, a second scan line 114d, a data line 114e, a common line 114f, and a pixel electrode 114g.

As shown in FIG. 1B, in the current embodiment of the present invention, the first scan line 114b and the first active device 114a are disposed at one side of the common line 114f, while the second scan line 114d and the second active device 114c are disposed at another side of the common line 114f. However, this is not for restricting the scope of the present invention. In other embodiment, one ordinary skilled in the art may design to configure the first scan line 114b, the first active device 114a, the second scan line 114d and the second active device 114c at a same side of the common line 114f. The present invention is not restricted by the layout as foregoing disclosed.

The first active device 114a and the second active device 114 may be thin film transistors (TFT). For example, the first active device 114a and the second active device 114 are illustrated by taking bottom gate TFTs as an example, but are not restricted to be bottom gate TFTs. In other embodiments, the first active device 114a and the second active device 114 may be top gate TFTs, or any other suitable TFTs. Further, in the current embodiment, the first active device 114a and the second active device 114 are illustrated as being TFTs of a same type. However, the present invention is not restricted as such. For example, in other embodiment, the first active device 114a and the second active device 114 may be different types of TFTs.

Figure 1C:
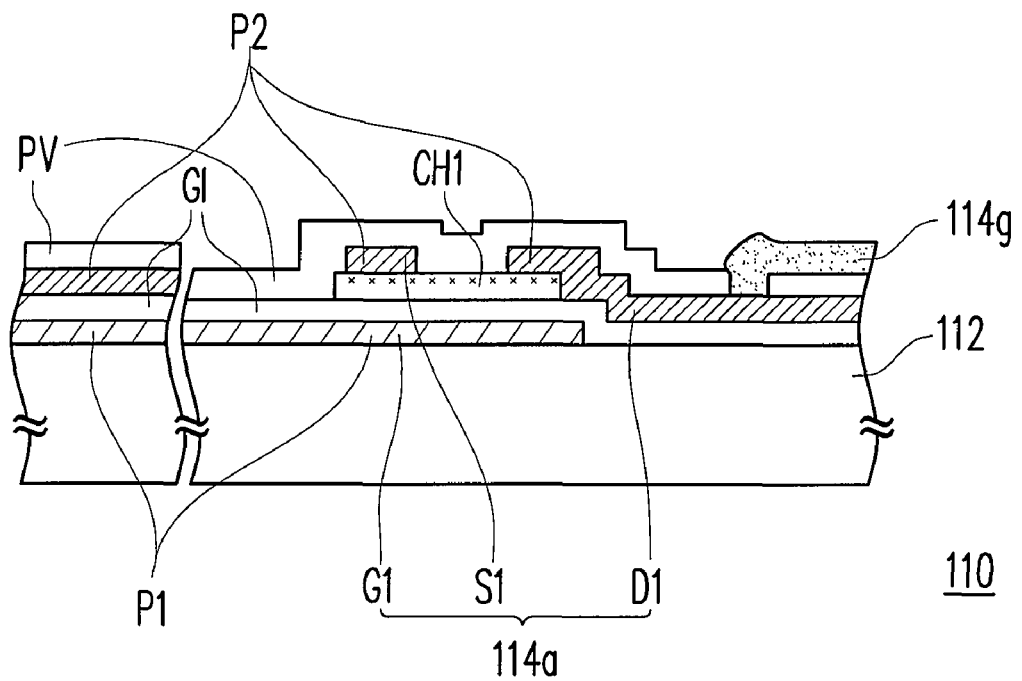
FIG. 1C is a cross-sectional view of the active device array substrate of FIG. 1B along line C1-C1'.

FIG. 1C is a cross-sectional view of the active device array substrate of FIG. 1B along line C1-C1'. Referring to FIGS. 1B and 1C together, the first active device 114a is disposed on the substrate 112. The first active device 114a includes a first gate G1, a first source S1, and a first drain D1. The first gate G1 is electrically connected to the first scan line 114b. The first source S1 is electrically connected to the data line 114e. The first drain line is electrically connected to the pixel electrode 114g.

Figure 1D:
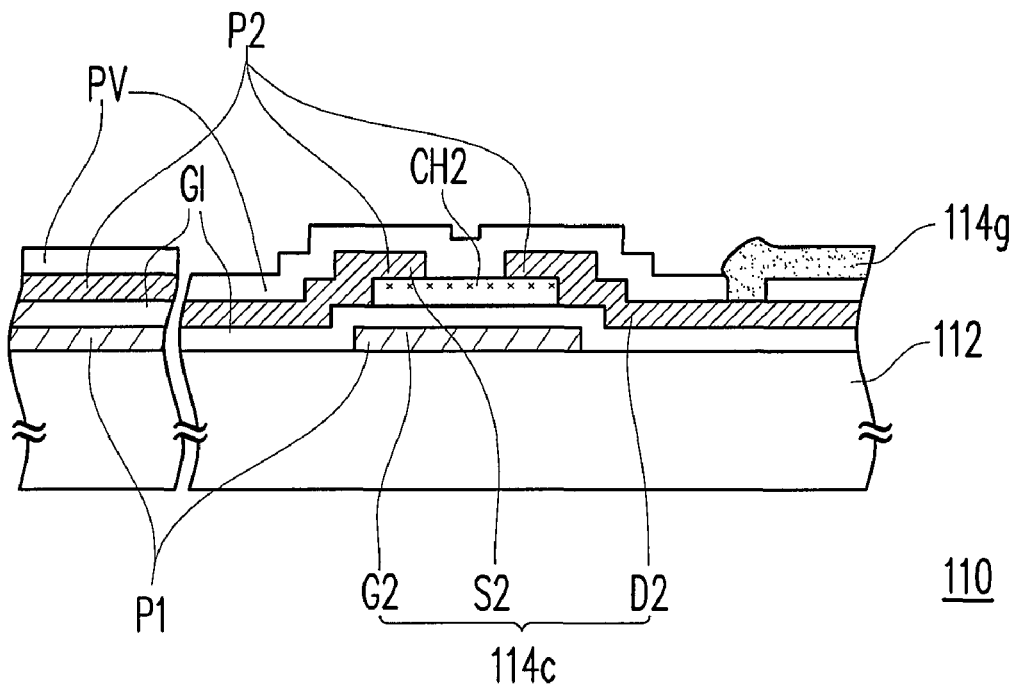
FIG. 1D is a cross-sectional view of the active device array substrate of FIG. 1B along line C2-C2'.

FIG. 1D is a cross-sectional view of the active device array substrate of FIG. 1B along line C2-C2'. Referring to FIGS. 1B and 1D together, the second active device 114c is disposed on the substrate 112. The second active device 114c includes a second gate G2, a second source S2, and a second drain D2. The second gate G2 is electrically connected to the second scan line 114d, and the second drain D2 is electrically connected to the pixel electrode 114g.

It should be noted that the common line 114f may further includes at least one branch 114f' extending therefrom and connected with the second source S2. Taking the pixel unit 114 for example, the common line 114f includes two branches 114f'. The second source S2 is electrically connected to the common line 114f via one of the branches 114f'. However, for the purpose of improving an aperture ratio (AR), or reducing crosstalk between the branches 114f' of the common line 114f and the other conductive layer, e.g., the data line 114e, or because of other considerations, one ordinary skilled in the art may modify the shape or vary the amount of the branches 114f'.

The data line 114e is electrically connected to the first source S1. As such, when the first active device 114a is turned on, the data line 114e is then electrically connected with the pixel electrode 114g via the first active device 114a, so that the image data on the data line 114e can be recorded into the pixel electrode 114g. Meanwhile, a voltage difference between the pixel electrode 114g and the common electrode 122 (as shown in FIG. 1A) is adapted to determine an arrangement of liquid crystal molecules of the liquid crystal layer 130, so as to drive the LCD panel 100 to display images with corresponding grey levels as desired. It should be noted that the voltage difference between the pixel electrode 114g and the common electrode 122 affects the arrangement of the liquid crystal molecules, and in this concern, the pixel electrode 114g and the common electrode 122 together with the liquid crystal molecules therebetween can also be considered as a liquid crystal capacitor Clc.

On another hand, the common line 114f is electrically connected with the second source S2. As such, when the second active device 114c is turned on, the common line 114f is electrically connected with the pixel electrode 114g via the second active device 114c. Therefore, a voltage of the pixel electrode 114g and a voltage of the common line 114f are at substantially the same level. Specifically, the common line 114f according to the present embodiment is electrically connected to a first common voltage Vcom1, so that the voltage difference between the pixel electrode 114g and the common electrode 122 (as shown in FIG. 1A) can be controlled to be substantially greater than a voltage difference $\Delta V$ corresponding to a grey level L0, such as lowest grey level. In this case, for example, if the luminance is divided into 225 levels, then the grey level L0 is a grey level under a darkest luminance corresponding to the voltage difference. Or the lowest grey level may be an initially grey level, an original grey level, an outset grey level, or a start grey level.

Figure 1E:
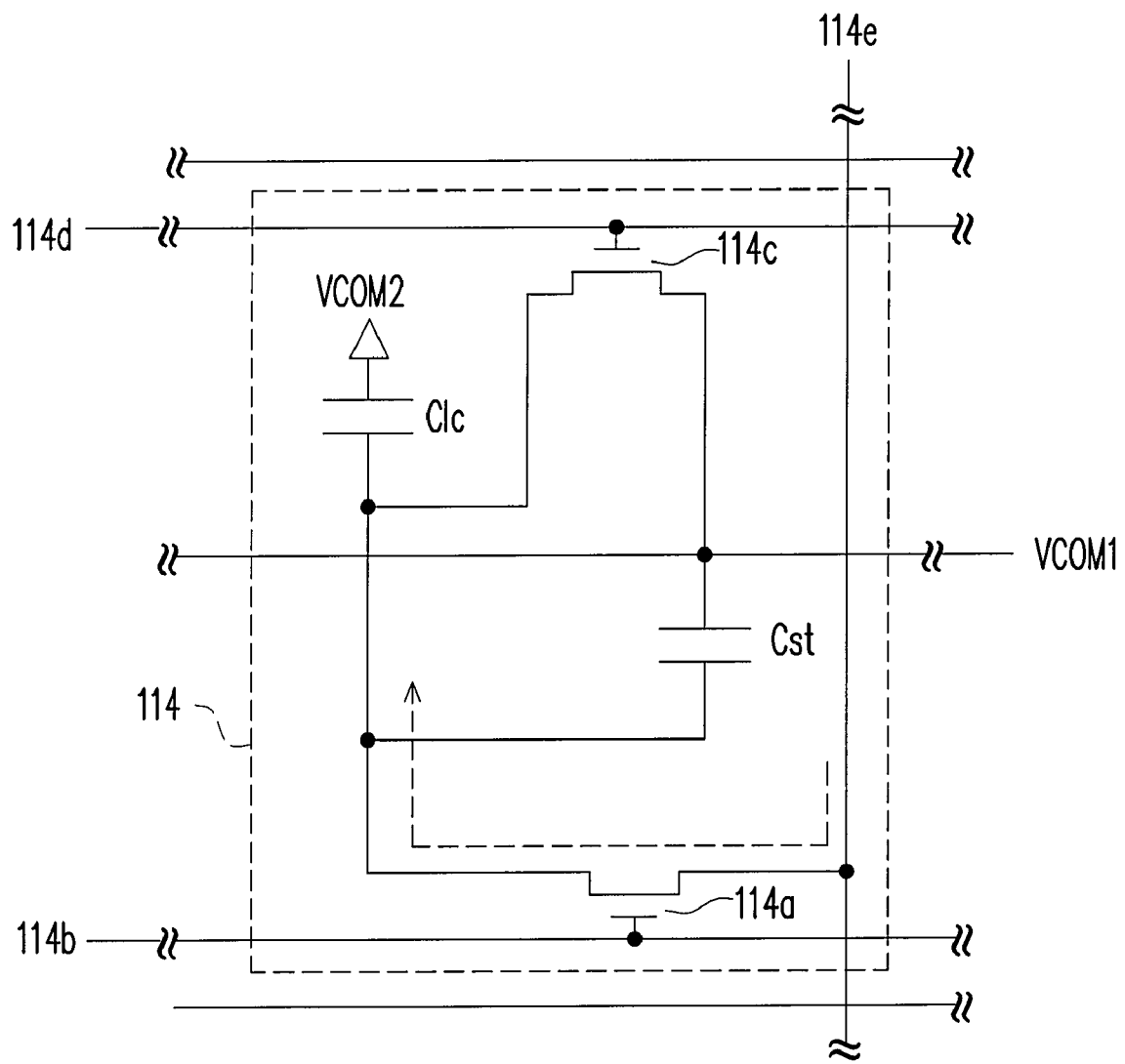
FIG. 1E is a circuit diagram of a part of an LCD panel according to an embodiment of the present invention.

Employing the active device array substrate 110 in the LCD panel 100, a circuit diagram of the LCD 100 is as shown in FIG. 1E. FIG. 1E is a circuit diagram of a part of an LCD panel according to an embodiment of the present invention. Referring to FIGS. 1A, 1B, 1D and 1E together, the active device array substrate 110 includes an array constituted by a plurality of pixel units 114 (only one shown in FIG. 1B). Taking one pixel unit 114 for example, the pixel unit 114 includes a first active device 114a and a second active device 114c. The second source S2 of the second active device 114a is coupled with the common line 114f. The common line 114f is electrically connected to a common voltage Vcom1. According to the current embodiment, the first active device 114a and the second active device 114c are disposed at different sides of the common line 114f. This is not for restricting the scope of the present invention, while in other embodiments, the first active device 114a and the second active device may be disposed at a same side of the common line 114f.

Further, the common electrode 122 of the opposite substrate 120 is electrically connected to a second common voltage Vcom2. An electrical field between the common electrode 122 and the pixel electrode 144g is provided for varying the arrangement of the liquid crystal molecules of the liquid crystal layer 130, so as to drive the LCD panel 100 to display images of different grey levels.

Figure 2:
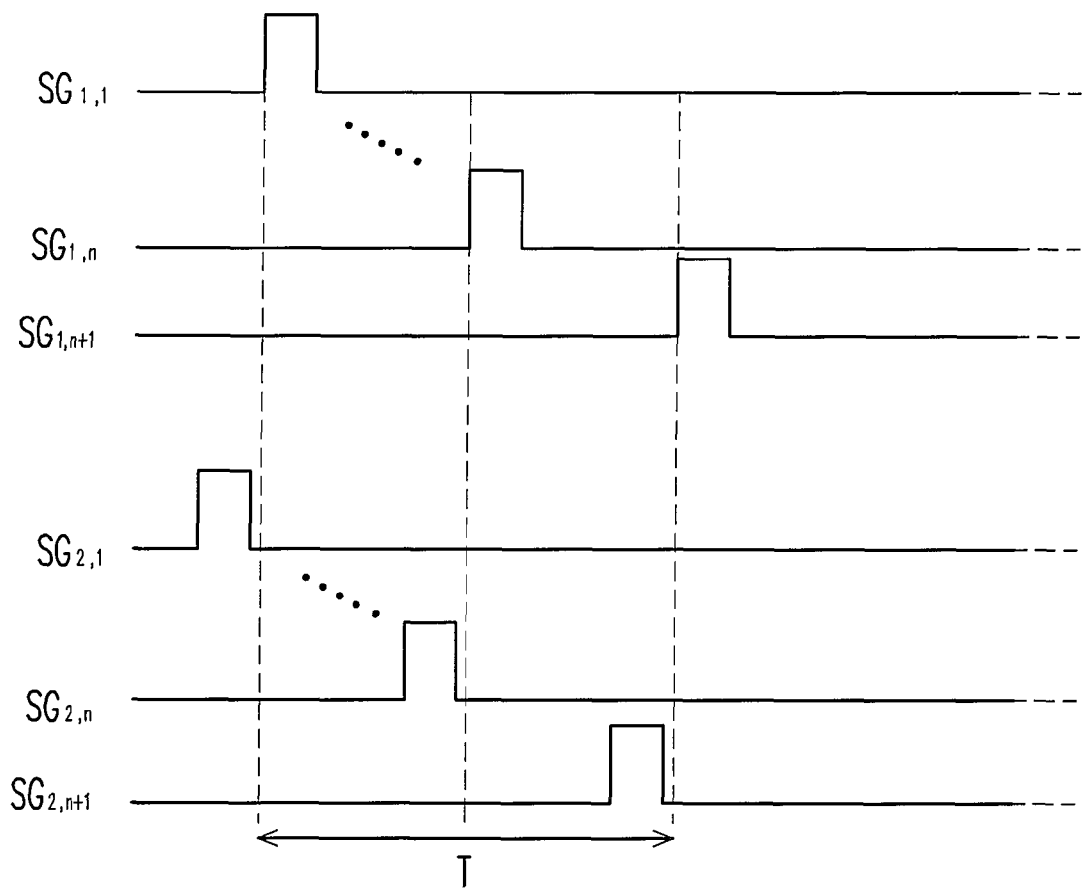
FIG. 2 is schematic diagram illustrating a driving clock sequence of an LCD panel according to an embodiment of the present invention.

FIG. 2 is schematic diagram illustrating a driving clock sequence of an LCD panel according to an embodiment of the present invention. Referring to FIGS. 1B, 1E, and 2, the active device array substrate 110 includes an array constituted by a plurality of pixel units 114 (only one shown in FIGS. 1B and 1E). As shown in FIG. 2, taking the LCD panel 100 as an example, the active device array substrate 110 includes n+1 rows of pixel units, n+1 first scan lines, and n+1 second scan lines, in which scan signals transmitted by the $1^{st}$ through the $n+1^{th}$ first scan lines are represented with $SG_{1,1}$ through $SG_{1,n+1}$, and scan signals transmitted by the $1^{st}$ through the $n+1^{th}$ second scan lines are represented with $SG_{2,1}$ through $SG_{2,n+1}$.

The $1^{st}$ through the $n+1^{th}$ first scan lines are adapted to transmit the scan signals $SG_{1,1}$ through $SG_{1,n+1}$ in a frame time T, and in the same time the image data are recorded into the $1^{st}$ row through the $n+1^{th}$ row of pixel units 114. Taking one pixel unit 114 as an example, when the pixel unit 114 receives the first scan signal $S_{G1,n}$, the first scan signal $S_{G1,n}$ turns on the first active device 114a, and the second scan signal $S_{G2,n}$ turns off the second active device 114c. In such a way, the image data can be recorded into the pixel unit 114. Further, because the common line 114f is applied with the first common voltage Vcom1, the pixel electrode 114g and the common line 114f configure a storage capacitor Cst which is adapted to maintain a level of the image data.

In another hand, the $1^{st}$ through the $n+1^{th}$ second scan lines are also adapted to transmit the scan signals $SG_{2,1}$ through $SG_{2,n+1}$ in a frame time T. Taking one pixel unit 114 as an example, when the pixel unit 114 receives the second scan signal $S_{G2,n}$, the second scan signal $S_{G2,n}$ turns on the second active device 114c, and the first scan signal $S_{G1,n}$ turns off the first active device 114a. In this case, the pixel electrode 114g is electrically connected to the common line 114f.

Further, because the voltage of the common line 114f is the first common voltage Vcom1, after electrically connected to the common line 114f, the voltage of the pixel electrode 114g also changes to the first common voltage Vcom1. In other words, in this time the voltage difference between the pixel electrode 114g and the common electrode 122 is |Vcom1−Vcom2|. Practically, the voltage difference |Vcom1−Vcom2| can be defined as substantially greater than the voltage difference $\Delta V$ corresponding to a grey level L0 such as a lowest grey level, so that the LCD panel 100 is driven to display an image with a grey level greater than L0, i.e., a black image. Or the lowest grey level may be an initially grey level, an original grey level, an outset grey level, or a start grey level.

It should be noted that the scan signal SG1,n and the scan signal SG2,n are transmitted to the pixel unit 114 at different times, and therefore the first active device 114a and the second active device 114c are also turned on at different times.

Specifically, when the first active device 114a is being turned on, the LCD panel 100 displays frames provided by the data line 114e, and when the second active device 114c is turned on, the LCD panel 100 displays a black frame by the voltage difference substantially greater than the voltage difference $\Delta V$ corresponding to a grey level L0 such as a lowest grey level. In other words, in a same row of pixel units, the first active devices are being charged for completing the writing operation of the image data, while the second active devices are similar as being discharged for changing the frame of the image data to a black frame. In such a way, in a next frame time T, it is looked like there is a black frame inserted with respect to each pixel unit.

Figure 3:
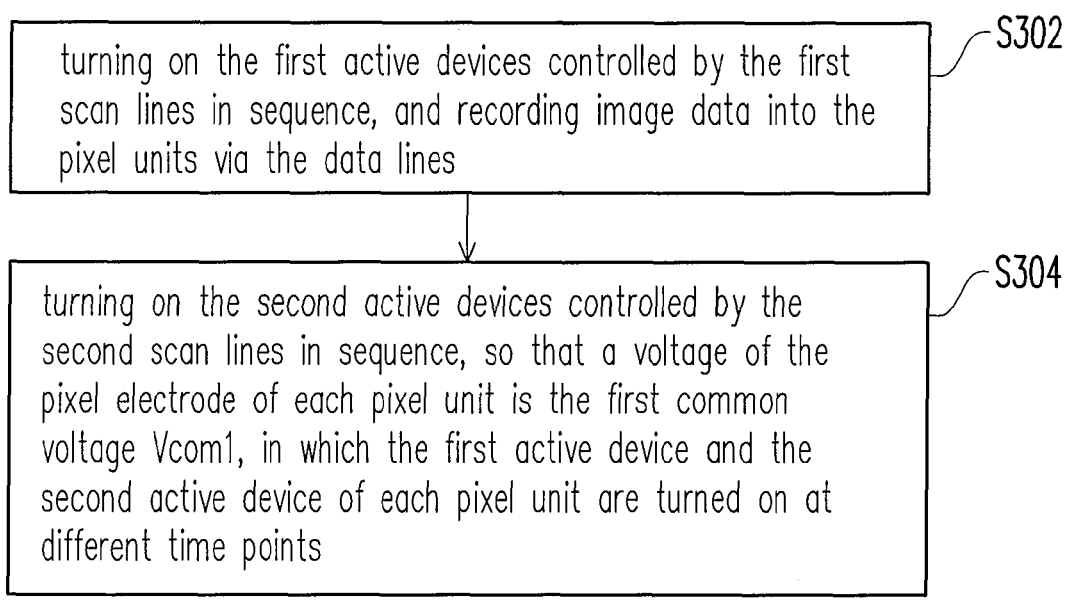
FIG. 3 is a flow chart illustrating a driving method according to an embodiment of the present invention.

FIG. 3 is a flow chart illustrating a driving method according to an embodiment of the present invention. The method is adapted for driving the LCD panel 100 as shown in FIG. 1A. Referring to FIG. 3, the method includes at least two steps as: first at step S302, the first active devices controlled by the first scan lines are turned on in sequence, and image data are recorded into the pixel units. Then at step S304, the second active devices controlled by the second scan lines are turned on in sequence, so that a voltage of the pixel electrode of each pixel unit is the first common voltage Vcom1. The first active device and the second active device of a same pixel unit are turned on at different times. Other details about the driving method can be known by referring to the foregoing embodiments, and are not to be iterated hereby.

Figure 4:
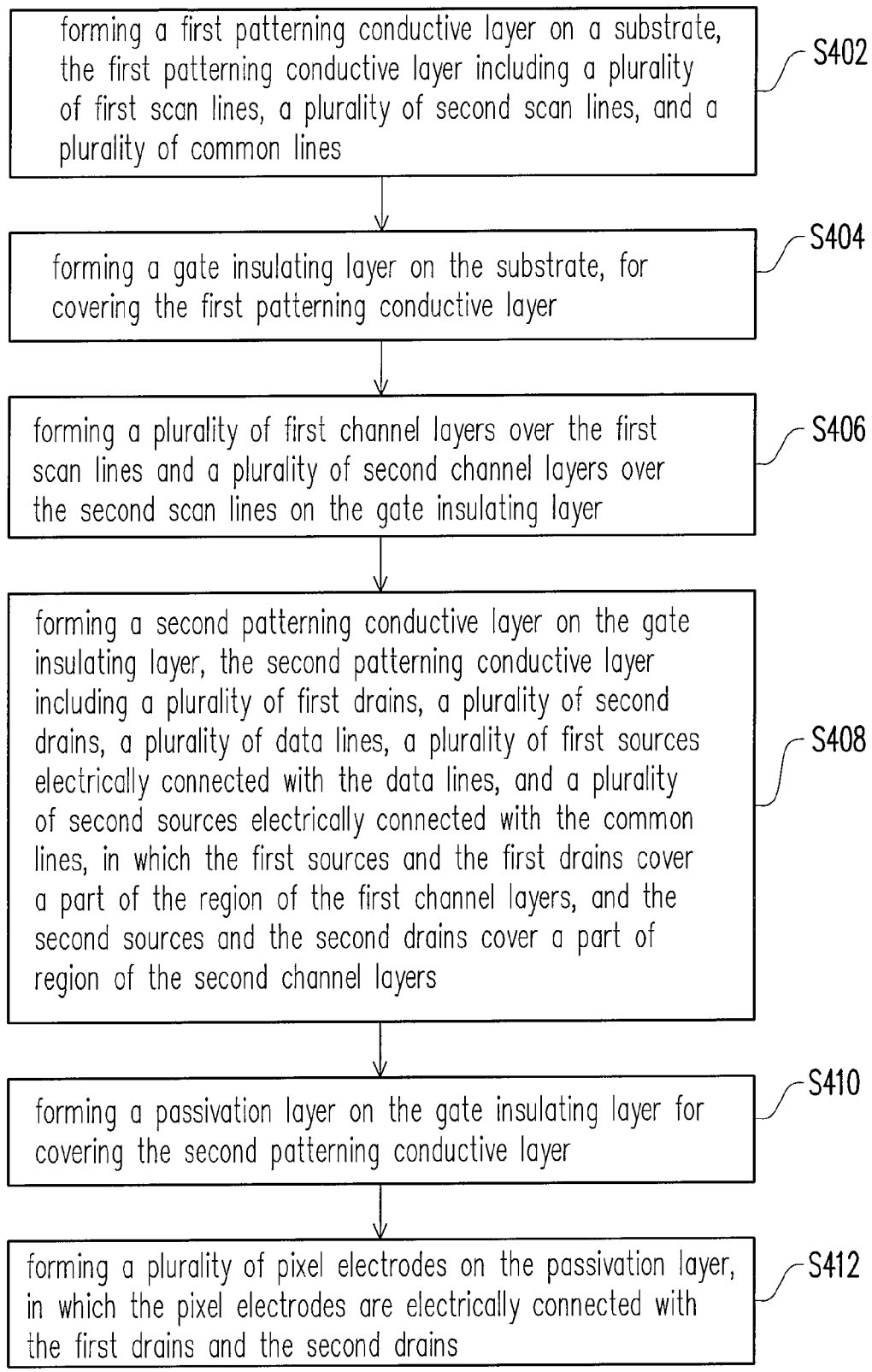
FIG. 4 is illustrates a method for fabricating an active device array substrate according to an embodiment of the present invention.

FIG. 4 is illustrates a method for fabricating an active device array substrate according to an embodiment of the present invention. The method is adapted for fabricating the active device array substrate 110 as shown in FIGS. 1B, 1C, and 1D. The embodiment is exemplified with but not restricted by a bottom gate TFT. Referring to FIGS. 1B, 1C, 1D, and 4 together, the method at least including: at step S402, a first patterned conductive layer P1 are configured on a substrate 112, the first patterned conductive layer P1 including a plurality of first scan lines 114b, a plurality of second scan lines 114d, and a plurality of common lines 114f (there are only one first scan line, one second scan line, and one common line shown in FIG. 1B).

Then at step S404, a gate insulating layer G1 is configured on the substrate 112 and covering the first patterning conductive layer P1. The gate insulating layer G1 includes a plurality of first contact openings (not shown), is adapted to expose a part of the common lines 114f, so that the second sources S2 are electrically connected to the common lines 114f via the first contact openings.

Then at step S406, a plurality of first channel layers CH1 are configured over the first scan lines 114b on the gate insulating layer and a plurality of second channel layers CH2 over the second scan lines 114d on the gate insulating layer (FIG. 1C shows one first channel layer only, and FIG. 1D shows one second channel layer only).

Then at step S408, a second patterned conductive layer P2 is configured on the gate insulating layer GI. The second patterned conductive layer P2 includes a plurality of first drains D1, a plurality of second drains D2, a plurality of data lines 114, a plurality of first sources S1 electrically connected with the data lines 114, and a plurality of second sources S2 electrically connected with the common lines 114f. The first sources S1 and the first drains D1 cover a part of the region of the first channel layers CH1. The second sources S2 and the second drains D2 cover a part of region of the second channel layers CH2 (FIG. 1A shows only one data line, FIG. 1C shows only one first source and only first drain; FIG. 1D shows only one second drain; and only one second drain). The first channel layers CH1 and the second channel layers Ch2 can be configured with a single layer structure or a multilayer structure, and can be made of polysilicon, amorphous silicon, monocrystalline silicon, microcrystalline silicon, nanocrystalline silicon, doped silicon composites having the foregoing crystalline, germanium silicon composites having the foregoing crystalline, organic semiconductors having the foregoing crystalline, any other suitable materials, or any combination of the foregoing.

At step S410, a passivation layer PV on the gate insulating layer GI and covering the second patterning conductive layer P2. The passivation layer PV includes a plurality of second contact openings (not shown), and a plurality of third contact openings (not shown).

At step S412, a plurality of pixel electrodes 114g are configured on the passivation layer PV (FIG. 1B shows only one pixel electrode). The pixel electrodes 114g are electrically connected with the first drains D1 and the second drains D2. For example, the pixel electrodes 114g are electrically connected with the first drains D1 via the second contact openings. The pixel electrodes 114g are electrically connected with the second drains D2 via the third contact openings.

After completing the steps S402, S404, S406, S408, S410, and S412, the foregoing structure can be further learnt by referring to the active device array substrate 110 of FIGS. 1B, 1C, and 1D.

In other embodiments, if one of the first active device 114a and the second active device 114c is a top gate TFT, the fabrication method has to be correspondingly modified. In this case, firstly, in a way of step S406, the first channel layers CH1 and the second channel layers CH2 are configured on the substrate 112; then in a way of step S404, the gate insulating layer GI is configured on the gate insulating layer GI, covering the first channel layers CH1 and the second channel layers CH2; then in a way of step S402, the first patterned conductive layer P1 is configured on the gate insulating layer GI, the first patterned conductive layer P1 including the first scan line 114b, the second scan line 114d, the common line 114f, and then the pixel electrode 114g, the passivation layer PV, the data line 114e, the first sources S1, the second sources S2, the first drains D1, and the second drains D2 are consequently configured as shown in steps S408, S410, and S412. However, it should be noted that there should be a pattern dielectric layer provided to cover the substrate between the steps S408 and S402, for avoiding a short circuit between the scan lines 114b and 114d and the data line 114e.

Further, the channel layers CH1 and CH2 of the foregoing embodiments of the present invention can be configured with different stacking structures in accordance with the active devices 114a and 114c. If at least one of the active devices 114a and 114c is a bottom gate TFT, then at least one of the channel layers CH1 and CH2 includes a vertical arrangement structure or a horizontal arrangement structure. Taking the vertical arrangement as an example, then at least one of the channel layers CH1 and CH2 includes a doped silicon layer and an undoped silicon layer beneath the doped silicon layer. Taking the horizontal arrangement as an example, then at least one of the channel layers CH1 and CH2 includes a silicon layer only, the silicon layer including a doped silicon region and an undoped silicon region. On the contrary, at least one of the active devices 114a and 114c is a top gate TFT, then at least one of the channel layers CH1 and CH2 includes a horizontal arrangement structure as discussed above.

Figure 5:
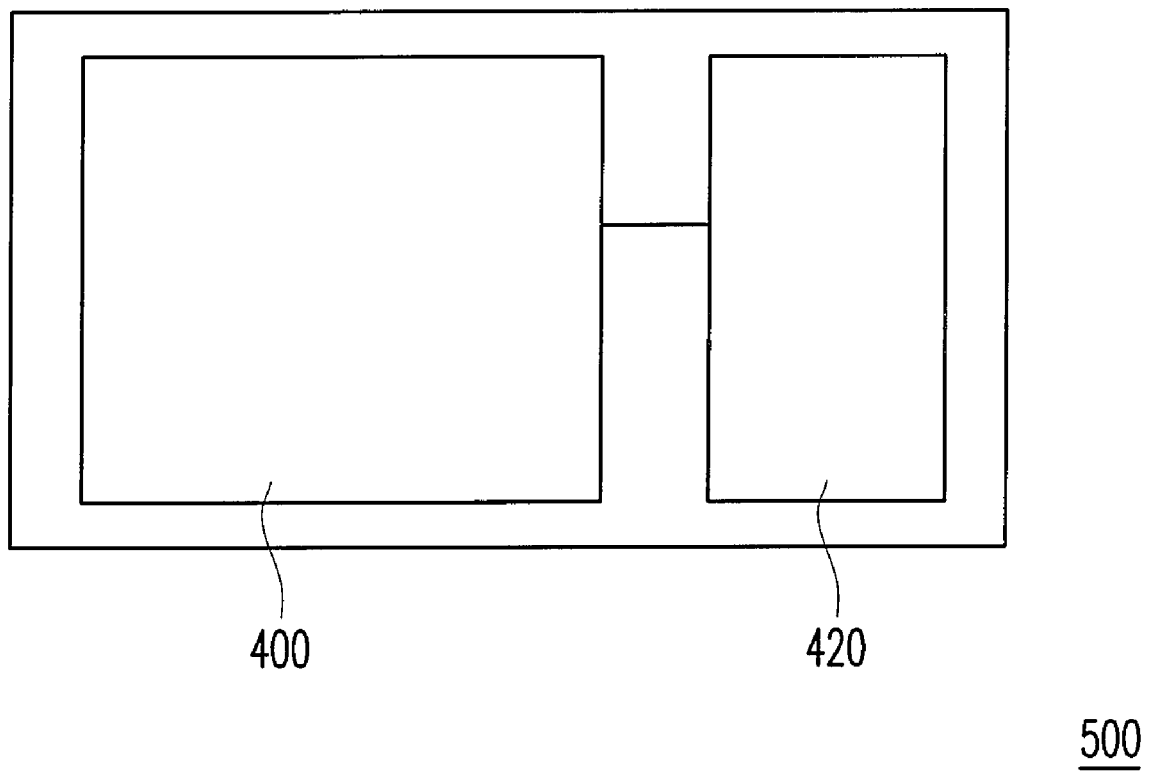
FIG. 5 is a schematic diagram illustrating an electro-optical device according to an embodiment of the present invention.

Furthermore, the active device array substrate 110 according to the foregoing embodiments can be used for the following LCD panels, such as: transmissive display panels, transflective display panels, reflective display panels, color filter on array display panels (COA), array on color filter display panels (AOC), vertical alignment (VA) display panels, in-plane switching (IPS) display panels, multi-domain vertical alignment (MVA) display panels, twisted nematic (TN) display panels, super twisted nematic (STN) display panels, pattern vertical alignment (PVA) display panels, super pattern vertical alignment (S-PVA) display panels, advanced super view (ASV) display panels, fringe field switching (FFS) display panels, continuous pinwheel alignment (CPA) display panels, axially symmetric aligned microcell (ASM) display panels, optically compensated bend (OCB) display panels, super in-plane switching (S-IPS) display panels, advanced super in-plane switching (AS-IPS) display panels, ultra fringe field switching (UFFS) display panels, polymer stable alignment (PSA) display panels, dual-view display panels, triple-view display panels, three-dimensional (3D) display panels, the above-mentioned display panel incorporating a touch/sensing function, or other suitable display panels. Wherein, touch function provided by resistive type, capacitive type, piezoelectric type, inductive type, micro-machined type, photo type, or other suitable type. Moreover, the foregoing display panels and the methods for driving/fabricating the same can also be used in driving/fabricating an electro-optical device. FIG. 5 is a schematic diagram illustrating an electro-optical device according to an embodiment of the present invention. Referring to FIG. 5, it shows an electro-optical device 500 including a display panel including the above-mentioned active device array substrate 110, and an electronic unit 420. The electronic unit 420 includes a control unit, an operation unit, a processing unit, a memory unit, a driving unit, a light emitting unit, a protection unit, a sensing unit, a detection unit, or other functional units, or a combination of the foregoing. The electro-optical device 500 for example can be a portable product (such as a mobile phone, a camcorder, a camera, a notebook computer, a gamer, a watch, a music player, an E-mail transceiver, a map navigator, a digital photograph, or like products), an audio/video product (such as an audio/video player or like products), a screen, a television, a screen of a trading system, an electronic board, a panel of a projector, or other suitable product.

In summary, the common line and the second active device of the active device array substrate of the LCD panel, and the electro-optical device of the present invention are adapted for black insertion with respect to the pixel electrode. However, when utilizing the second active device for black insertion, a charging time for charging the first active device is not affected. In other words, the problem of insufficient charging time won't be caused by the black insertion of the second active device of the LCD panel and the driving method thereof according to the embodiments of the present invention. Further, the present invention does not require an additional source driver (such as IC) for writing the image data of the black frame into the LCD panel via the data line, and therefore, the present invention saves the cost on the additional source driver and is featured with a less complex design.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device array substrate, comprising:
a substrate; and
a plurality of pixel units disposed on the substrate, each of the pixel units comprising:
a first active device disposed on the substrate, the first active device comprising a first gate, a first source, and a first drain;
a first scan line disposed on the substrate and electrically connected to the first gate of the first active device;
a second active device disposed on the substrate, the second active device comprising a second gate, a second source, and a second drain;
a second scan line disposed on the substrate and electrically connected to the second gate of the second active device;
a data line disposed on the substrate and electrically connected to the first source of the first active device;
a common line disposed on the substrate and electrically connected to the second source of the second active device; and
a pixel electrode disposed on the substrate and electrically connected to the first drain of the first active device and the second drain of the second active device,
wherein when the first active device is turned on, the data line and the pixel electrode are electrically connected to each other by the first active device, and when the second active device is turned on, the common line and the pixel electrode are electrically connected to each other by the second active device.

2. The active device array substrate according to claim 1, wherein the first active device of each pixel unit comprises a thin film transistor (TFT).

3. The active device array substrate according to claim 1, wherein the second active device of each pixel unit comprises a thin film transistor (TFT).

4. The active device array substrate according to claim 1, wherein the first scan line and the first active device of each pixel unit are disposed at one side of the common line, and the second scan line and the second active device of the pixel unit are disposed at another side of the common line.

5. The active device array substrate according to claim 1, wherein the common line of each pixel unit further comprises at least one branch, the branch being electrically connected to the second source of the second active device.

6. A liquid crystal display (LCD) panel, comprising:
an active device array substrate of claim 1, wherein the common line is electrically connected to a first common voltage Vcom1;
an opposite substrate comprising a common electrode electrically connected to a second common voltage Vcom2, wherein |Vcom1−Vcom2| is substantially greater than a voltage difference corresponding to a grey level L0; and
a liquid crystal layer disposed between the active device array substrate and the opposite substrate.

7. The LCD panel according to claim 6, wherein the first active device of each pixel unit comprises a thin film transistor (TFT).

8. The LCD panel according to claim 6, wherein the second active device of each pixel unit comprises a thin film transistor (TFT).

9. The LCD panel according to claim 6, wherein the first scan line and the first active device of each pixel unit are disposed at one side of the common line, and the second scan line and the second active device of the pixel unit are disposed at another side of the common line.

10. The LCD panel according to claim 6, wherein the common line of each pixel unit further comprises at least one branch, the branch being electrically connected to the second source of the second active device.

11. A method for driving an LCD panel of claim 6, the method comprising:
turning on the first active devices controlled by the first scan lines in sequence, and recording image data into the pixel units via the data lines; and
turning on the second active devices controlled by the second scan lines in sequence, so that a voltage of the pixel electrode of each pixel unit is the first common voltage Vcom1,
wherein the first active device and the second active device of each pixel unit are turned on at different time.

12. A method for fabricating an active device array substrate, comprising:
forming a first patterned conductive layer on a substrate, the first patterned conductive layer comprising a plurality of first scan lines, a plurality of second scan lines, and a plurality of common lines;
forming a gate insulating layer on the substrate, and covering the first patterned conductive layer;

forming a plurality of first channel layers over the first scan lines on the gate insulating layer and a plurality of second channel layers over the second scan lines on the gate insulating layer;

forming a second patterned conductive layer on the gate insulating layer, the second patterned conductive layer comprising a plurality of first drains, a plurality of second drains, a plurality of data lines, a plurality of first sources electrically connected with the data lines, and a plurality of second sources electrically connected with the common lines, wherein the first sources and the first drains cover a part of the region of the first channel layers, and the second sources and the second drains cover a part of region of the second channel layers;

forming a passivation layer on the gate insulating layer and covering the second patterning conductive layer; and forming a plurality of pixel electrodes on the passivation layer, wherein the pixel electrodes are electrically connected with the first drains and the second drains.

13. The method for fabricating an active device array substrate according to claim 12, wherein the gate insulating layer comprises a plurality of first contact openings exposing a part of the common lines, so that the second sources are electrically coupled with the common lines via the first contact openings.

14. The method for fabricating an active device array substrate according to claim 12, wherein the passivation layer comprises a plurality of second contact openings and a plurality of third contact openings, the pixel electrodes being electrically connected with the first drains via the second contact openings, and the pixel electrodes being electrically connected with the second drains via the third contact openings.

15. An electro-optical device, comprising an LCD panel of claim 6.

16. A method for driving an electro-optical device, comprising the method for driving an LCD panel of claim 11.

17. A method for fabricating an electro-optical device, comprising the method for fabricating an active device array substrate of claim 12.

* * * * *